United States Patent [19]

Nonaka

[11] 4,234,803
[45] Nov. 18, 1980

[54] INTEGRATED LOGIC CIRCUIT ARRANGEMENT

[75] Inventor: Terumoto Nonaka, Hamamatsu, Japan

[73] Assignee: Nippon Gakki Seizo Kabushiki Kaisha, Hamamatsu, Japan

[21] Appl. No.: 899,588

[22] Filed: Apr. 24, 1978

[30] Foreign Application Priority Data

Apr. 30, 1977 [JP] Japan .................................. 52-50258

[51] Int. Cl.³ .................. H03K 19/094; H03K 19/20; H03K 19/21
[52] U.S. Cl. .................................... 307/218; 307/213; 307/251; 307/304; 307/299 A
[58] Field of Search ............... 307/205, 213, 214, 218, 307/251, 304, 299 A

[56] References Cited

U.S. PATENT DOCUMENTS

| | | | |
|---|---|---|---|
| 3,495,097 | 2/1970 | Abramson et al. | 307/251 X |
| 3,582,975 | 6/1971 | King | 307/251 |
| 3,603,813 | 9/1971 | Hall | 307/264 X |
| 3,761,740 | 9/1973 | Naive | 307/251 X |

Primary Examiner—John Zazworsky
Attorney, Agent, or Firm—Cushman, Darby & Cushman

[57] ABSTRACT

An integrated logic circuit arrangement comprising: an input junction field effect transistor having at least one source for receiving a digital input signal, a drain to which a load is connected, and gate held at a reference potential, said junction field effect transistor being operative to effect switching operation in accordance with said digital input signal; and an output bipolar type transistor having its base connected to said drain to effect switching operation in accordance with an output signal delivered from said drain. This integrated logic circuit arrangement provides high speed logic operation, low power dissipation and high integration density.

11 Claims, 4 Drawing Figures

INTEGRATED LOGIC CIRCUIT ARRANGEMENT

BACKGROUND OF THE DISCLOSURE (a) Field of the invention

The present invention relates to circuit arrangement of integrated logic, and more particularly it concerns monolithic semiconductor integrated circuit arrangement which performs high-speed logic behavior with small power dissipation.

(b) Description of prior art

Circuit systems which have been proposed in the past for monolithic semiconductor logic circuit arrangements, include resistor-transistor logic (RTL), diode-transistor logic (DTL), transistor-transistor logic (TTL), emitter-coupled logic (ECL) and like logics. Recently, however, emitter-follower logic (EFL) and integrated injection logic (IIL) are attracting the attention of those concerned in the semiconductor field. These logic circuits are composed mainly of bipolar type elements, and such circuits are divided into the following two general categories, i.e. saturating type and non-saturating type, depending on the manner of their behavior.

A saturated type logic circuit, in general, is disadvantageous in that its operating speed is limited due to the inherent effect of so-called minority carrier storage. On the other hand, such disadvantage is not present in logic circuits of the non-saturating type. However, non-saturating type logic circuits have an inherent problem in that power dissipation is relatively great.

Furthermore, those logic circuits mentioned above, excepting IIL circuit, provided for only relatively low integration density.

SUMMARY OF THE INVENTION

It is, therefore, an object of the present invention to provide a novel circuit arrangement capable of providing high-speed logic operation, low power dissipation and high integration density.

According to an aspect of the present invention, there is provided a circuit system in which a junction field effect transistor and a bipolar type transistor are effectively combined. More particularly, the feature of the present invention lies in the arrangement whereby a junction field effect transistor with source serving as a signal input terminal and having a reference potential, supplied to its gate, provides; at the drain of the field effect transistor, a signal to the base of a bipolar type transistor. Here, the terms "field effect transistor" which are herein used and which will be hereinafter abbreviated as FET, and the terms "bipolar type transistor", refer to those transistors having such characteristics known in general as field effect transistor and bipolar transistor, respectively.

A junction field effect transistor which is abbreviated as J-FET is based on the majority carrier control. A J-FET is essentially free of the so-called minority carrier storage effect. Therefore, a J-FET is an element which is capable of performing high-speed operation. Since, however, a J-FET has been generally operated in the depletion mode, it has hardly been employed in logic integrated circuits in the past. According to the present invention, a J-FET of the depletion mode in association with a bipolar transistor is integrated in a logic circuit. The J-FET can be integrated with a relatively high density, and besides it can be manufactured relatively easily. In particular, vertical-type J-FET's are convenient for integrating together with bipolar type transistors.

In an example of the present invention, a bipolar type transistor effects switching operations either in phase or in opposite phase with the output of the J-FET provided in the preceding stage of a circuit arrangement. Where a switching operation in phase is required of the bipolar type transistor, it is preferred to connect a load resistor to the emitter electrode of this bipolar type transistor to cause this bipolar type transistor to provide non-saturating performance as an emitter-follower transistor. Causing the bipolar type transistor to provide non-saturating performance as an emitter-follower transistor is advantageous in materializing high speed logic, along with the high speed property of the J-FET in the preceding stage.

Conversely, a switching output in the opposite phase, can be obtained by connecting a load resistor to the collector side of the bipolar type transistor to cause the bipolar type transistor to perform as an inverter transistor.

In constructing a logic circuit in general, it should be noted that the majority of the constituents of such circuit can be composed of non-inverting logic. For example, RS-latch (reset-set latch), D-latch (delay latch), D-flip-flop (delay flip-flop), shift register, multiplexer, buffer and the like can be constructed with non-inverting logic, using only AND's and OR's. On the other hand, such circuits as adders, JK flip-flops, ring counters and the like require inverting logic. However, those inverting logic are needed only very partially, and the majority parts can be composed of non-inverting logic.

The present invention is particularly advantageous when utilized in integrated circuits composed of non-inverting logic. Nevertheless, the present invention can be easily applied to inverting logic.

According to the present invention, an AND gate can be easily constructed by employing a J-FET having a multisource structure, and by so doing it is possible to attain a wired OR gate on the output side of the emitter-follower transistor. Furthermore, a bipolar type transistor having a multi-emitter structure can be utilized with emitters in a number corresponding to the required number of fan-outs.

An example of the present invention will hereunder be described by referring to the accompanying drawings.

DETAILED DESCRIPTION OF THE PREFERRED EMBODIMENT

Figure 1:
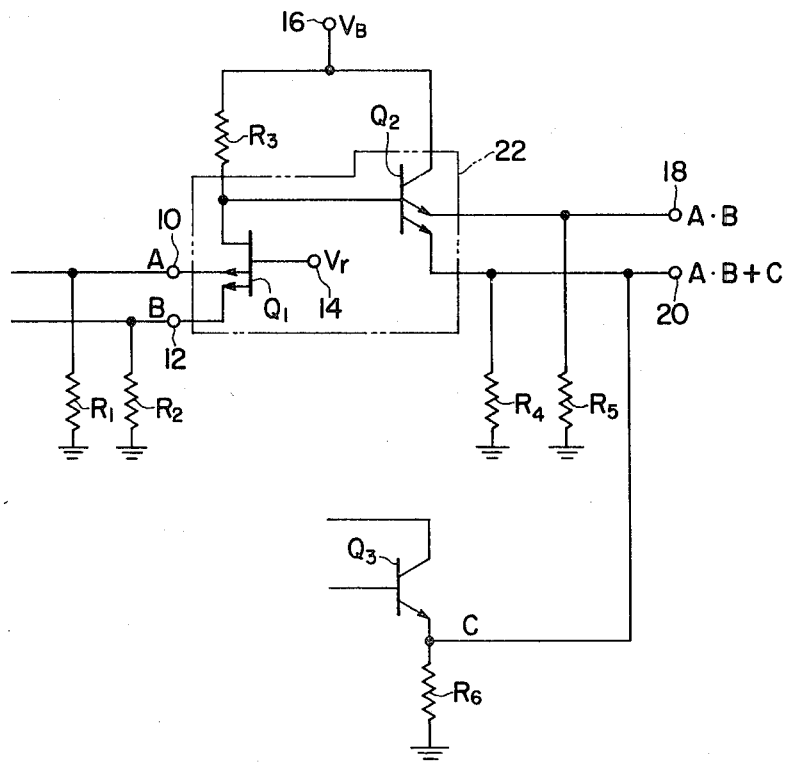
FIG. 1 is a circuit diagram of the integrated logic circuit according to an example of the present invention.

FIG. 1 shows an example of the integrated logic circuit system according to the present invention. In FIG. 1, reference numeral $Q_1$ represents an input J-FET, and $Q_2$ represents an output bipolar type transistor. The J-FET $Q_1$ is of a multisource structure. In FIG. 1, this J-FET is shown to have two sources. Input terminals 10 and 12 are connected to these sources, respectively. To these input terminals 10 and 12 are supplied binary input signals A and B from load resistors $R_1$ and $R_2$, respectively, which are provided in the preceding stage. To the gate of the J-FET $Q_1$ is applied a reference potential $V_r$ which is such that, when an input signal is "0" (a low potential), the transistor $Q_1$ is rendered "on", and that, when the input signal is "1" (a high potential), this transistor $Q_1$ is rendered "off". The drain of the J-FET $Q_1$ is connected to an operation power supply terminal 16 via a load resistor $R_3$. This operation power supply terminal 16 is applied with an operating potential $V_B$.

A bipolar type transistor $Q_2$ is of a multi-emitter structure having its base directly connected to the drain of the J-FET $Q_1$. In FIG. 1, this bipolar type transistor $Q_2$ is shown as having two emitter electrodes. To these emitter electrodes are connected load resistors $R_4$ and $R_5$, respectively. In addition, the operating potential $V_B$ is applied to the collector of the bipolar type transistor $Q_2$ via the power supply terminal 16, so that this bipolar type transistor $Q_2$ serves to constitute an emitter-follower stage. To the two emitter electrodes of the transistor $Q_2$ are connected output terminals 18 and 20, respectively. To the output terminal 20 is also added a binary output signal C which is supplied from the connecting point of an emitter electrode of another bipolar type transistor $Q_3$ which constitutes another emitter-follower stage and a load resistor of this emitter electrode. Thus, there is constructed the so-called wired OR logic. The circuit portion 22 which contains the FET $Q_1$ and the bipolar type transistor $Q_2$ is integrated in such form as will be described later in connection with the exemplary illustration of FIG. 3. It should be noted, however, that load resistors $R_1$ through $R_5$ are formed integrally, as diffused regions or polycrystalline silicon region, in the semiconductor substrate in which the circuit portion 22 is integrated. Furthermore, the above-said another emitter-follower stage containing therein the bipolar type transistor $Q_3$ and the load resistor $R_6$ is integrated also in the same semiconductor substrate as that for the aforesaid circuit portion 22.

Figure 2:
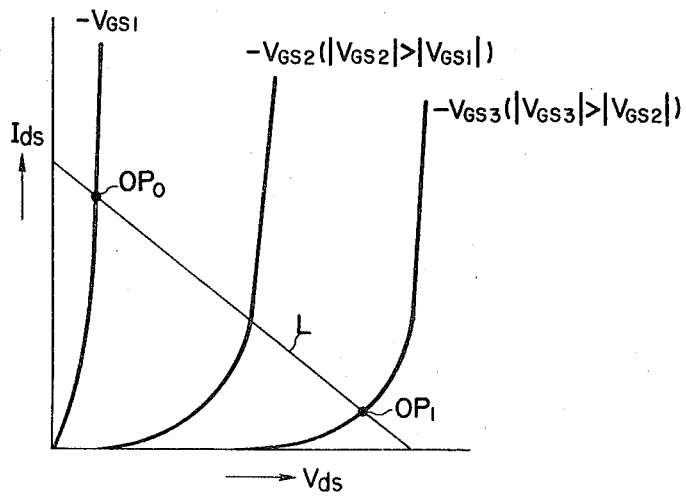
FIG. 2 is a chart showing the characteristic of the J-FET of FIG. 1.

Next, the behavior of the circuitry shown in FIG. 1 will be described hereinbelow by referring to an example of output characteristic of J-FET $Q_1$ shown in FIG. 2. It should be noted that, as shown, this J-FET exhibits a non-saturating characteristic and thus this J-FET is what is called a static induction transistor (SIT). Let us now suppose that this J-FET is of the n-channel type FET, and that the bipolar type transistor is of the npn type transistor. Then, it is assumed that the voltage $V_B$ of the power supply is selected to be a positive voltage in the range of about 1V to about 5V, and that the gate potential $V_r$ of the FET $Q_1$ is set so as to have either a value zero or a negative value relative to the source or drain of this FET. The resistor $R_3$ serves to define the load line L shown in FIG. 2. In FIG. 2, the reference symbol $OP_0$ represents the operating point of the circuitry shown in FIG. 1 when the input is "0". $OP_1$ represents the operating point at the input of "1". Here, it should be noted that the characteristic curves employed are such that have been modified by the autobiasing by the load resistors $R_1$ and $R_2$.

Suppose that either one of the input signals A and B which are to be supplied to the respective ones of the multiple sources of the J-FET $Q_1$ is "0" (which means a low level). The FET $Q_1$ will then be rendered "on", lowering the base potential of the bipolar type transistor $Q_2$ due to a voltage drop across the resistor $R_3$. The bipolar type transistor $Q_2$ is thereby turned off, so that the potentials of the output terminals 18 and 20 will become "0" or a low level.

Contrarily, if both of the input signals A and B are "1" (which means a high level), then the J-FET $Q_1$ will be rendered "off" and the base potential of the bipolar transistor $Q_2$ will have a high level. Thus, the potentials of the output terminals 18 and 20 will become "1" (a high level).

As stated above, an AND function can be attained by means of the multiple sources of the J-FET $Q_1$, and there are derived, at both output terminals 18 and 20, an AND (A·B) output of both input signals A and B, respectively. Also, from the output terminal 20 to which the output C of said another emitter-follower stage is connected in a wired OR fashion, there is obtained an OR (A·B+C) output of the output A·B and the output C.

Such logic operation as stated above can be performed at a high speed without being substantially accompanied by the minority carrier storage effect, by arranging so that the gate of the J-FET will be zero-biased or negatively biased relative to either the source or the drain (depending on the whether the J-FET is p-channel or n-channel), for each of the input signals of "1" and "0".

Next, description will be made of an example of the integrated structure of the circuit portion 22 which contains the J-FET $Q_1$ and the bipolar type transistor $Q_2$ which are mentioned above. The semiconductor substrate 30 which is made of, for example, silicon, comprises a $p^-$ type semiconductor layer 31, $n^+$ type embedded diffusion layers 32A and 32B, and n type isolated regions 34A and 34B which are formed by electrical isolation-separation of an n type epitaxial growth layer 34 by an isolation region 36. This isolation region 36 may be constructed by an $SiO_2$ layer which is formed by relying on the known selective oxidizing technique, or alternatively it may be constructed by a $p^+$ type diffusion layer which is formed by relying on the known selective diffusion method. Said n type isolated region 34A is intended for the formation of the J-FET $Q_1$, whereas the n type isolated region 34B is intended for the formation of the bipolar type transistor $Q_2$.

Within the n type isolated regions 34A and 34B, there may be formed, as required, relatively deep $n^+$ type diffusion layers 37 and 39 for making it feasible to establish a low resistance contact to both the drain and the collector, as shown by broken lines, respectively. It should be understood, however, that whether these $n^+$ type diffusion layers 37 and 39 are to be arranged so as to reach the $n^+$ type diffusion layer 32A assigned for the drain and reach the $n^+$ type diffusion layer 32B assigned for the collector can be determined arbitrarily as desired. Such deep $n^+$ type diffusion layers 37 and 39 are formed preferably by relying on the simultaneously selective diffusion technique. In case the n type epitaxial growth layer 34 has a relatively low impurity concentration (a high specific resistance), it is desirable to provide $n^+$ type diffusion layers 37 and 39.

Within the n type isolated region 34A, there is formed further a $p^+$ type gate diffusion region 38 in such pattern as leaving a plurality of source regions therein. Similarly, within the n type isolated region 34B, there is formed a p+ type inactive base diffusion region 40 in such a pattern as to leave a plurality of emitter-forming regions therein. These p+ type diffusion layers 38 and 40 are preferably formed by relying on the simultaneous selective diffusion technique. In the n type region 34B, it should be understood that, preferably after forming p type active base regions 42a and 42b by relying on the ion-implantation technique, there are formed n+ type diffusion regions 48a and 48b of emitter in the emitter-forming regions, and along therewith an n+ type diffusion region 50 for collector contact purpose is formed. In the n type isolated region 34A, it should be understood that, in the source region which is located adjacent to the p+ type region 38, there are formed n+ type diffusion regions 44a and 44b for ohmic contact purpose, respectively. Also, simultaneously therewith, an n+ type diffusion region 46 is formed for drain ohmic contact purpose. Those n+ type diffusion regions 44a, 44b, 46, 48a, 48b and 50 preferably are formed at the same time.

The surface of the semiconductor substrate 30 is covered with a passivation film 52 which may be comprised of an $SiO_2$ film. On top of this passivation film 52 are formed an electrode layer and a wiring layer by relying on the known techniques. These layers may include source electrode layers 54a and 54b of the J-FET $Q_1$; a gate electrode layer 56; a wiring layer 58 for inter-connecting the drain of the FET $Q_1$ and the base 40 of the transistor $Q_2$; emitter electrode layers 60a and 60b of the transistor $Q_2$; and a collector layer 62.

It should be understood that, within the n type isolated region 34B, there may be incorporated a transistor $Q_3$ for use as the emitter-follower stage shown in FIG. 1 by relying on a process similar to that for the transistor $Q_2$ and yet by using the n+ type collector diffusion layer 32B as the common collector region. Also, though not shown, it will be obvious to those skilled in the art that the load resistors $R_1$ through $R_6$ may be easily materialized by the provision of resistances made of diffusion resistors, or polysilicon or metal evaporation resistor (including deposition).

According to the above-mentioned integrated structure, it will be noted that the J-FET $Q_1$ and the bipolar type transistors $Q_2$ and $Q_3$ can be integrated together on a same semiconductor substrate by relying on the manufacturing techniques in which substantially all the manufacturing steps are common for the FET and the bipolar type transistors. These bipolar type transistors only need to be such that they have such a bipolar characteristic as the collector current versus collector voltage characteristic of an ordinary bipolar transistor. It should be noted also that the above-discussed integrated structure can be processed in the same way as and can exist on an identical semiconductor substrate with a logic element called static induction transistor logic (SITL, see Nikkei Electronics, Feb. 21, 1977, pages 35 to 37) which is such that the switching transistor portion of IIL is replaced by an SIT having a triode vacuum tube-like characteristic. In such an instance, there is needed only a simple mask designing and an interface designing.

The use of an SIT having a triode vacuum tube-like characteristic is preferred for J-FET $Q_1$. It should be noted, however, a J-FET having a pentode vacuum tube-like characteristic can be used also, provided that it has a large saturating current value.

Figure 3:
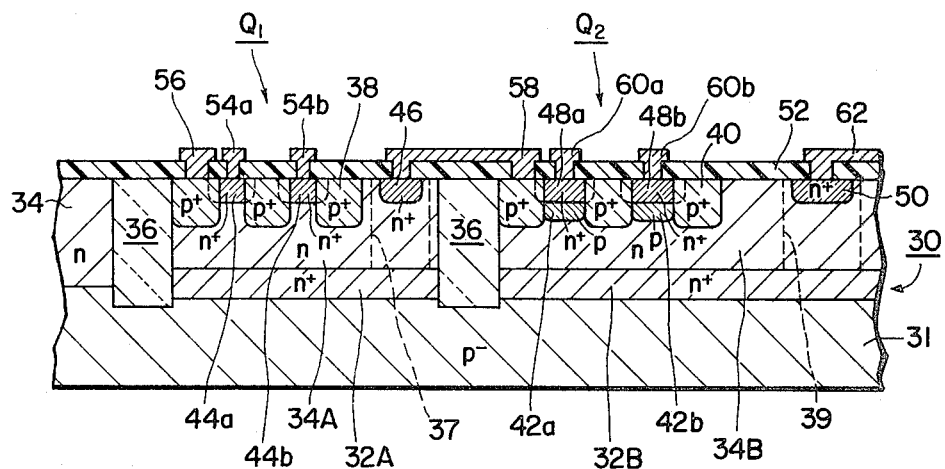
FIG. 3 is a diagrammatic partial illustration of a cross section of an example of the monolithic circuit structure where the circuit of FIG. 1 is used.

It should be noted also that said bipolar-type transistor $Q_2$ shown in FIG. 3 is just an example, and that the structure of this FIG. 3 accordingly is just an example and not limited to this structure. Thus, this transistor $Q_2$ may be any transistor so long as it has a bipolar-like characteristic similar to the collector current versus collector voltage characteristic of an ordinary bipolar transistor.

The present invention has been described with respect mainly to non-inverting logic. It should be understood, however, that the present invention can apply equally effectively to inverting logic as well.

Figure 4:
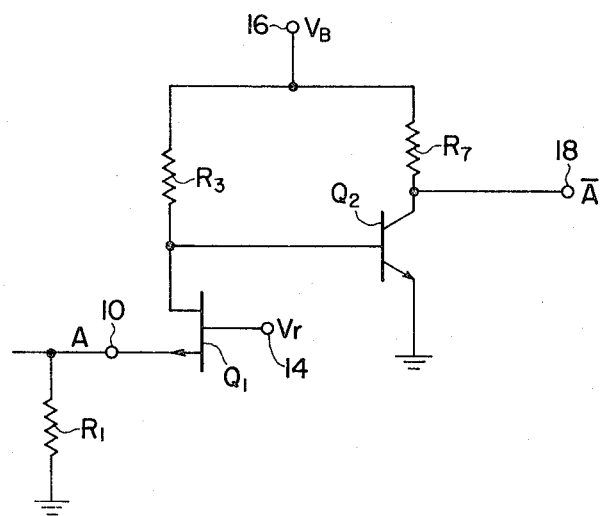
FIG. 4 is a circuit diagram showing a circuit arrangement using inverted logics, according to another embodiment of the present invention.

In case inverting logics are needed it is only necessary to arrange, as shown in FIG. 4, so that the emitter of the transistor $Q_2$ is grounded, that the collector is connected to the power supply terminal 16 via a load resistor $R_7$, and that an output terminal 18 is connected to the junction point of the collector and the load resistor $R_7$. In such an instance, the transistor $Q_2$ will function as an inverter, and there is obtained from the output terminal 18 an inverted output $\overline{A}$ of the input A. It should be noted that the circuitry shown in FIG. 4 also can be integrated in the same way as is the circuitry of FIG. 1.

According to the integrated logic circuit system of the present invention stated above, there are obtained such advantages as listed below.

(1) A high speed logic operation is ensured. This is possible for the following reasons. They are: the J-FET is not accompanied by a minority carrier storage effect, and yet the emitter-follower stage is a non-saturating circuit. Thus there is no delay from storage in the collector. In the base also, the storage effect can be almost negligible because the inactive base region has a high impurity concentration.

(2) The density of integration is relatively high. This is because of the fact that the AND is constructed by multiple inputs, and the OR is constructed by wired logic. Furthermore, this high integration density is contributed also by the fact that the bipolar type transistor can be integrated by relying on a common collector structure.

(3) The power dissipation is relatively small. This is because the operation voltage level can be dropped to as low as about 1 volt.

What is claimed is:

1. An integrated logic circuit arrangement comprising:
    an input junction field effect transistor having at least one source for receiving a digital input signal, a drain to which a load is connected, and a gate held at a fixed DC reference potential, said junction field effect transistor being operative to effect switching operation in accordance with said digital input signal, said load being adapted for connection between said drain and a power source;
    an output bipolar type transistor having its base connected to said drain to effect switching operation in accordance with an output signal delivered from said drain;
    said output bipolar type transistor having a load connected to the emitter of said output bipolar transistor, whereby said output bipolar transistor behaves as an emitter-follower transistor; and
    a second emitter-follower transistor,
    the emitter of said output bipolar type transistor serving as the first mentioned emitter-follower transistor being connected to an emitter output terminal of said second emitter-follower transistor to thereby form a wired OR logic circuit.

2. An integrated logic circuit comprising:

an input junction field effect transistor having at least one source for receiving a digital input signal, a drain to which a load is connected, and a gate, held at a reference potential, said junction field effect transistor being operative to effect switching operation in accordance with said digital input signal said load being connected between said drain and a power source; and an output bipolar type transistor having its base connected to said drain to effect switching operation in accordance with an output signal delivered from said drain, the emitter of said output bipolar type transistor having a load connected thereto whereby said output bipolar transistor behaves as an emitter-follower transistor, wherein further the emitter of said output bipolar transistor is connected to an output terminal of another emitter-follower transistor to form a wired OR logic.

3. An integrated logic circuit comprising:

an input junction field effect transistor having a plurality of sources, each receiving a respective digital input signal, a drain having a load connected thereto, and a gate held at a reference potential, said plural source junction field effect transistor being operative to effect switching operation in accordance with said digital input signal and an output bipolar type transistor having its base connected to said drain to effect switching operation in accordance with an output signal delivered from said drain, whereby an AND logic is formed.

4. An integrated logic circuit arrangement according to claim 3, in which: said output bipolar type transistor has a load connected to the emitter thereof, whereby said output bipolar transistor operates as an emitter-follower transistor.

5. An integrated logic circuit arrangement according to claim 4, in which: the emitter of said output bipolar type transistor serving as the emitter-follower transistor is connected to an output terminal of another emitter-follower circuit, thereby forming a wired OR logic.

6. An integrated logic circuit arrangement according to claim 3, in which: the collector of said output bipolar type transistor has its collector connected to a load, so that this transistor serves to operate as an inverter.

7. The integrated logic circuit of claim 3 wherein output bipolar type transistor includes a plurality of emitters.

8. An integrated logic circuit arrangement comprising:

an input junction field effect transistor having a plurality of sources for receiving digital input signals, a drain to which a load is connected, and a gate held at a fixed DC reference potential, said junction field effect transistor being operative to effect switching operation in accordance with said digital input signal, said plural sources forming an AND logic; and an output bipolar type transistor having its base connected to said drain to effect switching operation in accordance with an output signal delivered from said drain.

9. An integrated logic circuit arrangement according to claim 8, in which: said output bipolar type transistor has a load connected to the emitter of said output bipolar transistor, whereby said output bipolar transistor behaves as an emitter-follower transistor.

10. An integrated logic circuit arrangement according to claim 9, further comprising a second emitter-follower transistor in which: the emitter of said output bipolar type transistor serving as the first mentioned emitter-follower transistor is connected to an output terminal of said second emitter-follower transistor thereby forming a wired OR logic.

11. An integrated logic circuit arrangement according to claim 8, in which: the collector of said output bipolar type transistor is connected to a load, so that said output bipolar transistor serves to operate as an inverter.

* * * * *